United States Patent
Pau

[11] Patent Number: 5,995,578
[45] Date of Patent: Nov. 30, 1999

[54] WINDOWED CLOCK GENERATION

[75] Inventor: Danilo Pau, Sesto S. Giovanni, Italy

[73] Assignee: STMicroelectronics S.r.l, Agrate Brianza, Italy

[21] Appl. No.: 08/784,966

[22] Filed: Jan. 16, 1997

[30] Foreign Application Priority Data

Jan. 19, 1996 [EP] European Pat. Off. .............. 96830018

[51] Int. Cl.$^6$ ................................................. H03K 21/00
[52] U.S. Cl. ............................................................. 377/47
[58] Field of Search ................................................ 377/47

[56] References Cited

U.S. PATENT DOCUMENTS 5,608,656 3/1997 Purcell et al. ..................... 364/715.02

*Primary Examiner*—Margaret R. Wambach
*Attorney, Agent, or Firm*—Allen, Dyer, Doppelt, Milbrath & Gilchrist, P.A.

[57] ABSTRACT

Perfectly resynchronized windowed clock signals are constructed starting from a main clock signal of the same frequency of that of the active phases of the constructed windowed clock signal, advantageously without requiring a main clock of a higher frequency.

8 Claims, 10 Drawing Sheets

WINDOWED CLOCK GENERATION

FIELD OF THE INVENTION

In general, the present invention relates to processing digital systems using timing signals (clocks), and, more particularly, to a method and a device for generating a "windowed" clock signal, that is, a clock signal characterized by a succession of periods or active phases during which the signal has a certain frequency, and of inactive period phases during which there isn't any signal at the frequency.

BACKGROUND OF THE INVENTION

In processing systems that utilize a plurality of identical pipelines substantially operating in parallel according to a so-called systolic scheme, and to process in parallel data belonging to blocks of data fed in series to the various pipelines, it might be useful or necessary to use a particular timing or clock signals characterized by having active periods alternating with inactive periods. This is commonly defined as windowed clocks, whereby the active period may have a duration different from the period of inactivity. Such requirements occur, for example, in the so-called motion estimators. A motion estimator is a digital processor that calculates an estimate of the motion in a video frame (VF) using a reference frame (RF). Each of the blocks (VF) into which the video frame is normally divided and which for example may be of 16×16 pixels (pels), is compared to a correspondent block or with equivalent blocks of the reference frame RF that are within the search area defined by the position of the particular block of the video frame VF. For example, if the dimensions of the search area are 46×46 pels, there will be 31×31 blocks that the motion estimator will have to compare with the block of the video frame VF. The motion estimator will find the block in the search area that is more similar to the block of the video frame VF and will make available the data that define its position in the search area.

In practice, the motion estimation processor is a machine that must compare many blocks with each other and this means that it would be advantageous to use many processing pipelines (PEs) functioning in parallel. A controller would then coordinate the functions of the different pipelines.

FIG. 1 shows a simplified functional scheme of a motion estimation processor. The systolic array (LINEAR ARRAY OF PE) represents a linear structure of identical processing elements, (PEs), functioning in parallel. The flow of data through the array needs to be controlled by a controller (CONTROLLER). Each PE works in parallel to all the other PEs of the array and the current video block is fed along the array according to a local communication control. The absolute values of the differences between the VF and RF blocks, calculated by the PEs, are stored as distortions in a dedicated accumulator (ACCUMULATOR). The comparators (COMPARATOR) receive representative data of the various distortions in sequence and retain (select) the data relative to the minimum distortion detected. The primary function of the CONTROLLER is that of producing a windowed clock having active phases or periods alternating with inactive phases or periods, for coordinating the functions of the plurality of processing pipelines (PEs) that make up the linear array.

FIG. 2 shows the way a typical windowed clock signal is produced. If f is the clock frequency during active phases, a typical way of producing the windowed clock signal is to start from a clock signal (2f) having twice that frequency. The 2f frequency can be divided by two through a common digital divider thus obtaining an f frequency signal, and by a larger multiple of two (in the example by 16), thus obtaining an f/16 frequency signal. These two derived clock signals of fractional frequency in respect to the frequency 2f of the starting signal, obtained by digital frequency division, are supplied to an AND gate to produce the required windowed clock signal that represents the logic product of the two derived clocks, as diagrammatically illustrated in FIG. 2.

The delay introduced by the combinatory logic AND circuit can be, as it is well known, eliminated by using a D-latch circuit, to which the 2f frequency signal may be fed as the sampling clock signal. The disadvantage of this method is represented by requiring a 2f frequency primary signal that is twice the clock frequency actually required during the active phases of the windowed clock signal to be produced. For example in a typical application of a motion estimate system, the requisite of having a windowed clock signal with a frequency, during the active phases, of 72 MHz would require the availability of a master clock signal with twice that frequency, that is of 144 MHz. Clearly, this aspect may be extremely burdensome because it may impose severe constraints to the hardware architecture and to the components used.

SUMMARY OF THE INVENTION

Confronted with these difficulties, a method and relative device has now been found whereby it is possible to construct or derive the required windowed clock signal without the need for a 2f master clock signal. This objective is reached by deriving the windowed clock signal from a master clock signal whose frequency can be that of the same windowed clock signal during its active phases.

According to a first aspect of the method of the invention, digital frequency division of a master clock signal generates at least a first derived clock signal with a first frequency submultiple by a factor equivalent to an integer multiple (n) of two of the master clock frequency, and a second derived clock signal having a second frequency submultiple by a factor equivalent to an integer multiple (m) of two of the master clock frequency, and where m is greater than n, for establishing a certain ratio between active and inactive intervals of the windowed clock signal. Optionally, a time shift of the first one of the two derived clock signals that is of the highest frequency one of the derived clocks equivalent to an odd integer multiple of a semiperiod of the master clock signal may be produced, and the two clock signals may be fed to the inputs of a logic AND gate. The logic product signal of the two clock signals output by the AND gate defines the active and inactive intervals, that is, the defined windows of the clock signal.

Therefore, a perfect synchronism with the main clock signal is restored, eliminating the delays introduced by the combinatory logic gate, while producing at the same time a pair of resynchronized signals out-of-phase by a semiperiod of the master clock signal. The pair of out-of-phase and resynchronized signals are fed to the inputs of an exclusive OR (XOR) gate to output the desired windowed clock signal whose frequency during its active phases may be equal to that of the master clock signal (in case that the first of the two derived clock signals employed has a halved frequency (n=1) with respect to the frequency of the master clock signal). In view of the resynchronization of the pair of input signals of the XOR gate and by suitably designing the XOR circuit a windowed clock output signal with satisfactory characteristics is obtained without requiring starting with a "double" frequency main clock.

According to another aspect of the invention, the circuit device of the invention is characterized in that it comprises a first time-shift block of a derived clock signal of fractional frequency with respect to the master clock frequency. The time-shift block employs at least a D-Latch stage and more preferably an array of D-Latch stages in cascade, all employing the master clock as the timing signal. The input signal and the signals present at the respective outputs of the various D-Latch stages in cascade may be selected through a multiplexer to construct a windowed clock signal according to the requisites of the specific application.

Such a derived, fractional frequency clock signal, eventually shifted, as selected through the multiplexer, is applied to a first input of an AND gate, to a second input of which is applied a second derived clock signal of fractional frequency with respect to the master clock frequency and whose value is in a certain ratio with respect to the frequency of the first derived clock signal. The ratio between the frequencies of the two derived fractional frequency clock signals fed to the inputs of the AND gate is such to produce certain ratio between the duration of the active phases and of the inactive phases of the windowed signal output by the AND gate and the period of the derived signal having the highest frequency.

The circuit further comprises a second and a third resynchronization circuit, realized with a number D-Latch stages (timed by the master clock signal) different from each other by an odd integer number. The windowed signal output by the AND gate is fed to an input of the second and third circuits to obtain, at the respective outputs, a pair of windowed signals, both resynchronized with the master clock signal and having the same frequency during their respective active phases, corresponding to a fractional value of the frequency of the master clock signal. Therefore, these two resynchronized signals are out-of-phase by essentially a semiperiod of the master clock signal. This pair of resynchronized, fractional frequency and out-of-phase windowed clock signals are fed to the inputs of an XOR gate which produces at its output the desired windowed clock signal with a frequency during the active phases that can be identical to the frequency of the master clock.

Another aspect of the invention is that of permitting the generation of a windowed clock signal in which the active and inactive phases have different duration in terms of number of master clock cycles, in other words an "asymmetric" windowed clock signal.

This can be obtained by generating a logic product of a derived clock signal, shifted by a multiple integer of a semiperiod of the master clock signal or of one of a plurality of derived fractional frequency clock signals available at the respective outputs of a frequency divider block, with another derived signal whose semiperiod has a duration equal to the duration of the active phase of the desired windowed clock and essentially lower than the semiperiod of the first derived clock signal. In this way, an asymmetric clock signal having a certain duty-cycle may be produced. This asymmetric derived clock signal may then be resynchronized with the master clock signal and used in place of the second derived clock signal to produce the logic product (AND) signal which will be then resynchronized and phase-shifted by a semiperiod of the master clock signal to generate the pair of resynchronized and out-of-phase signals that are applied to the inputs of the final XOR logic circuit to output the desired asymmetric, windowed clock signal.

BRIEF DESCRIPTION OF THE DRAWINGS

The various aspects and relative advantages of the invention will be even more evident through the following description of some important embodiments and by referring to the attached drawings, wherein.

DETAILED DESCRIPTION OF THE PREFERRED EMBODIMENTS

Figure 1:
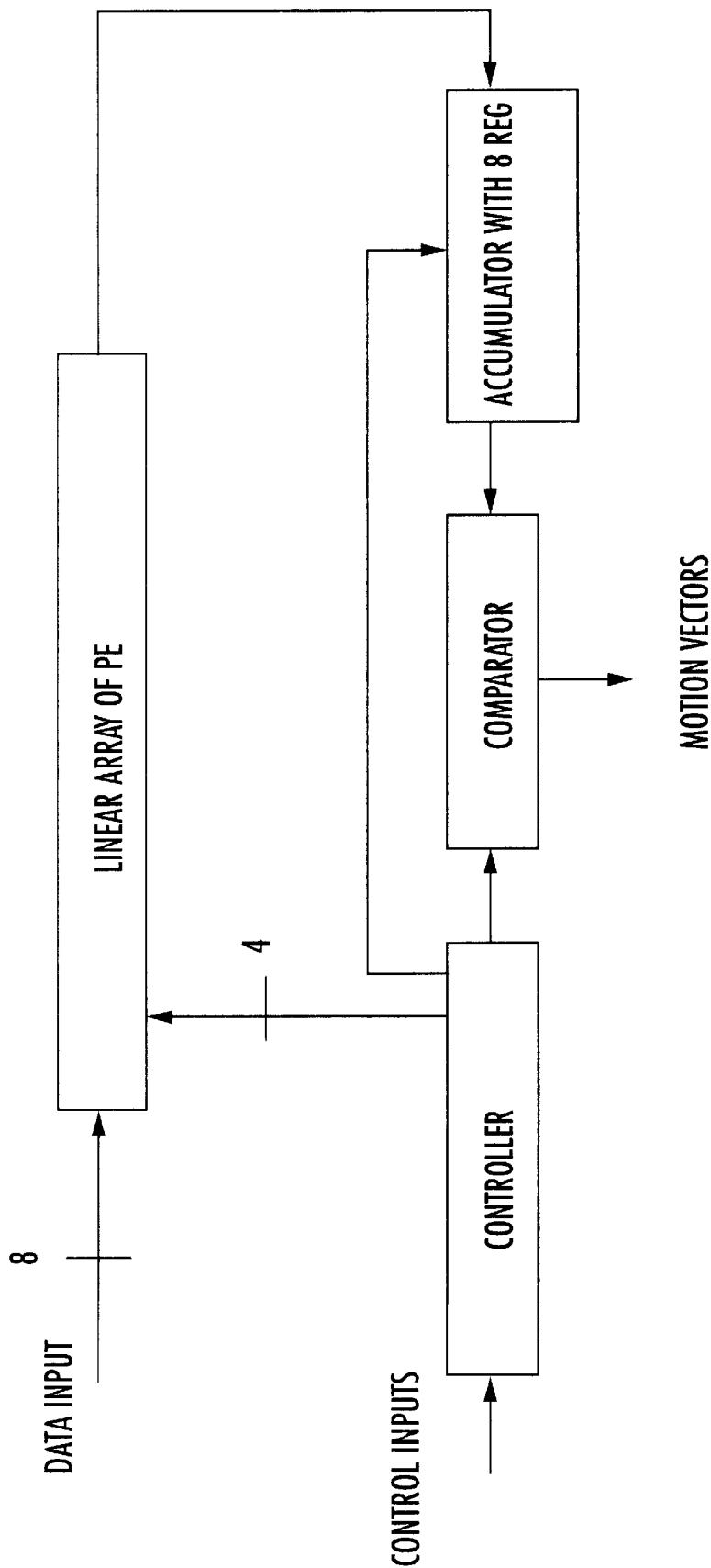
FIG. 1 shows, as already mentioned, the scheme of a motion estimation processor, in which a windowed clock signal is used to synchronize the functioning of an array of identical processing modules working in parallel as in the prior art.
Figure 2:
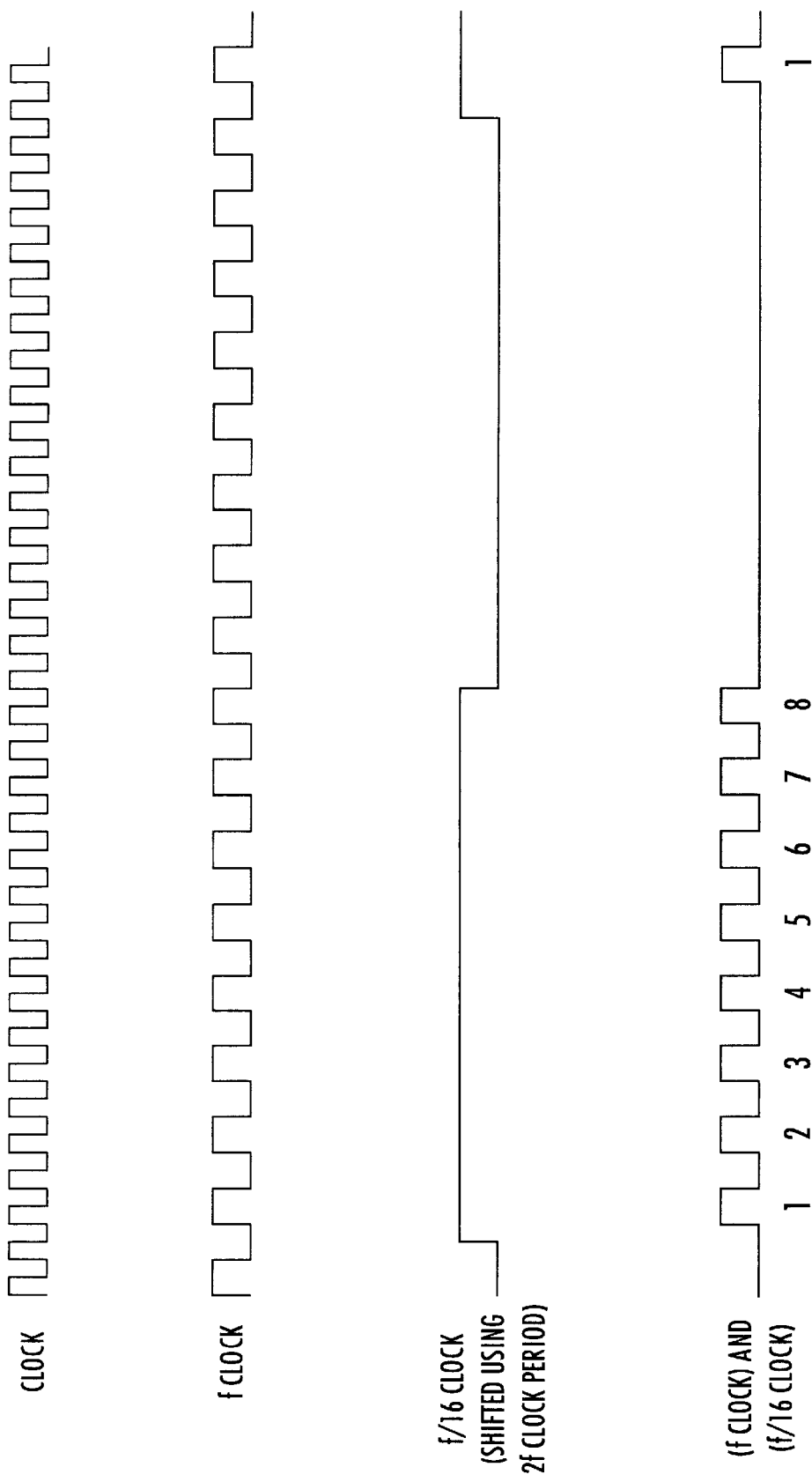
FIG. 2 diagrammatically illustrates a typical method of deriving a windowed clock signal, according to a common practice as in the prior art.
Figure 3:
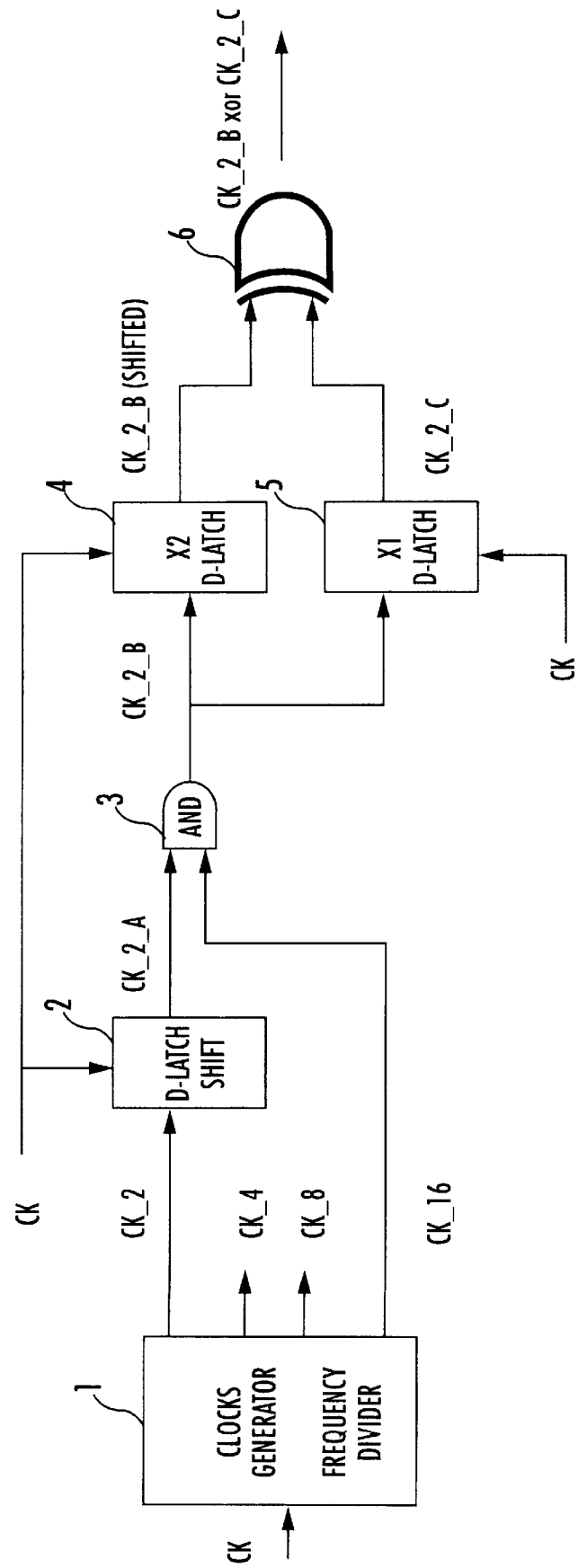
FIG. 3 shows the basic architecture of the circuit of the invention.

An embodiment of the invention is schematically shown in FIG. 3. By way of example only, suppose that a windowed clock signal having eight cycles of activity at the main clock frequency CK are followed by eight cycles of inactivity. Starting from a main clock signal CK, the first block 1 (CLOCKS GENERATOR) that may contain a plurality of frequency divider circuits, produces a plurality of derived clock signals with binary fractional frequencies, namely: CK__2, CK__4, CK__8 and CK__16. Of course, the block 1 may be designed for producing any number of derived signals (depending on the foreseeable requirements).

By way of example, for the application considered the derived clocks CK__2 and CK__16 with a halved frequency and with a frequency equivalent to a sixteenth of the main clock signal frequency CK, respectively, are utilized. The derived clock CK__2 may be treated in a phase-shifting block 2 (D-Latch SHIFT), timed by the main clock CK, which, in the illustrated example, outputs the signal CK__2__A which is shifted by a semiperiod of the CK main clock frequency with respect to the input signal CK__2.

Figure 6:
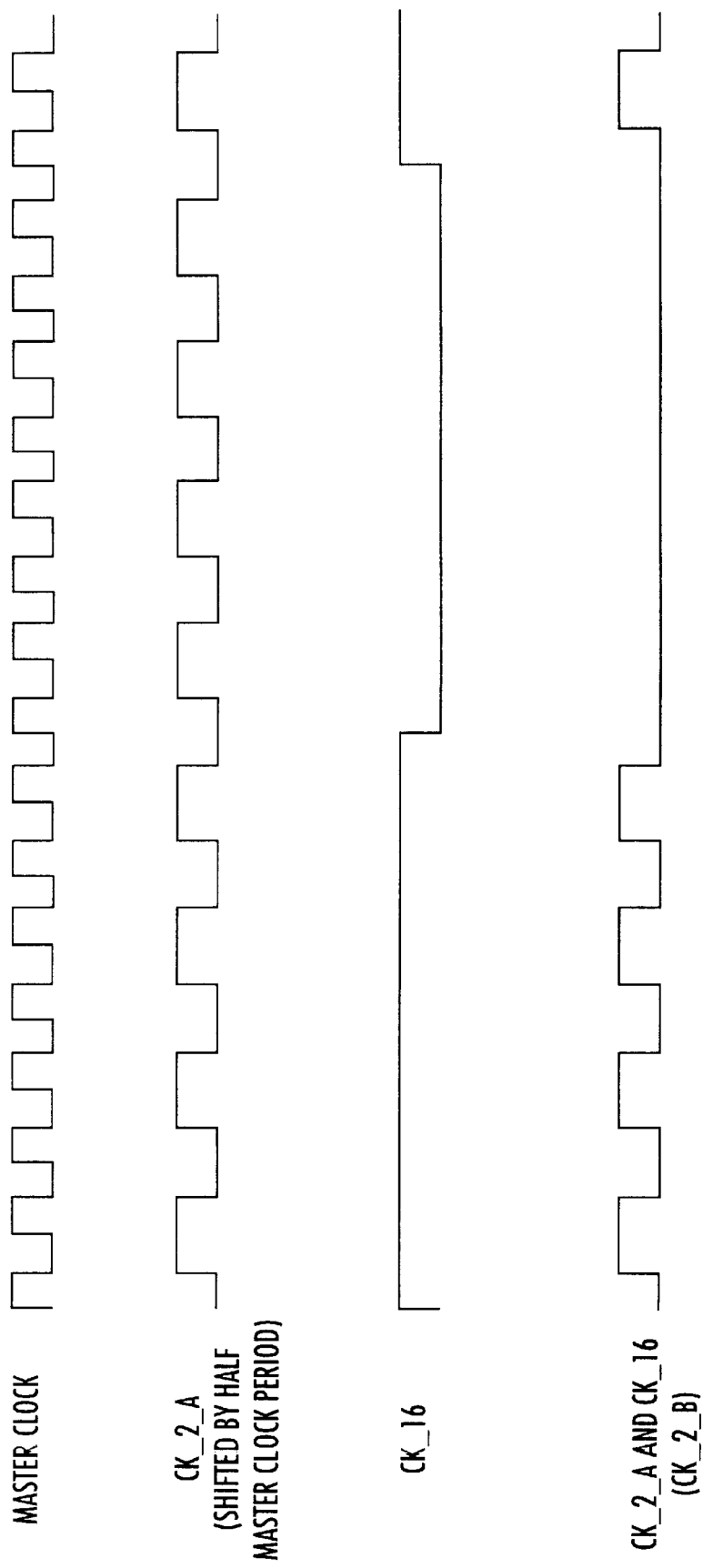
FIGS. 6 and 7 diagrammatically illustrate the way a symmetric windowed clock signal can be produced by the circuit of FIG. 3.

The signal CK__2__A and the signal CK__16 are fed to the input of an AND logic circuit 3, which produces at its output a signal CK__2__B equivalent to the logic product of the two input signals. Therefore, this CK__2__B signal defines the intervals or, in other words, the windows of the clock signal being constructed, in terms of number of a semiperiods of the derived clock signal CK__2__A that has the lowest frequency of the two input signals, as illustrated in the diagrams of FIG. 6.

The signal CK__2__B has an active phase of four cycles or periods of the derived fractional frequency signal CK__2__A (that is having half the frequency of the clock CK), followed by four inactive cycles or periods thereof. This signal CK_2_B, precursor of the desired windowed clock signal, is fed to the respective inputs of two resynchronization blocks 4 and 5, both timed at main clock (CK) frequency. As shown, the first resynchronization block 4 may be constituted by two D-Latch stages in cascade (x2D-Latch) while the second block 5 may be constituted by a single D-Latch stage (x1D-Latch).

Figure 7:
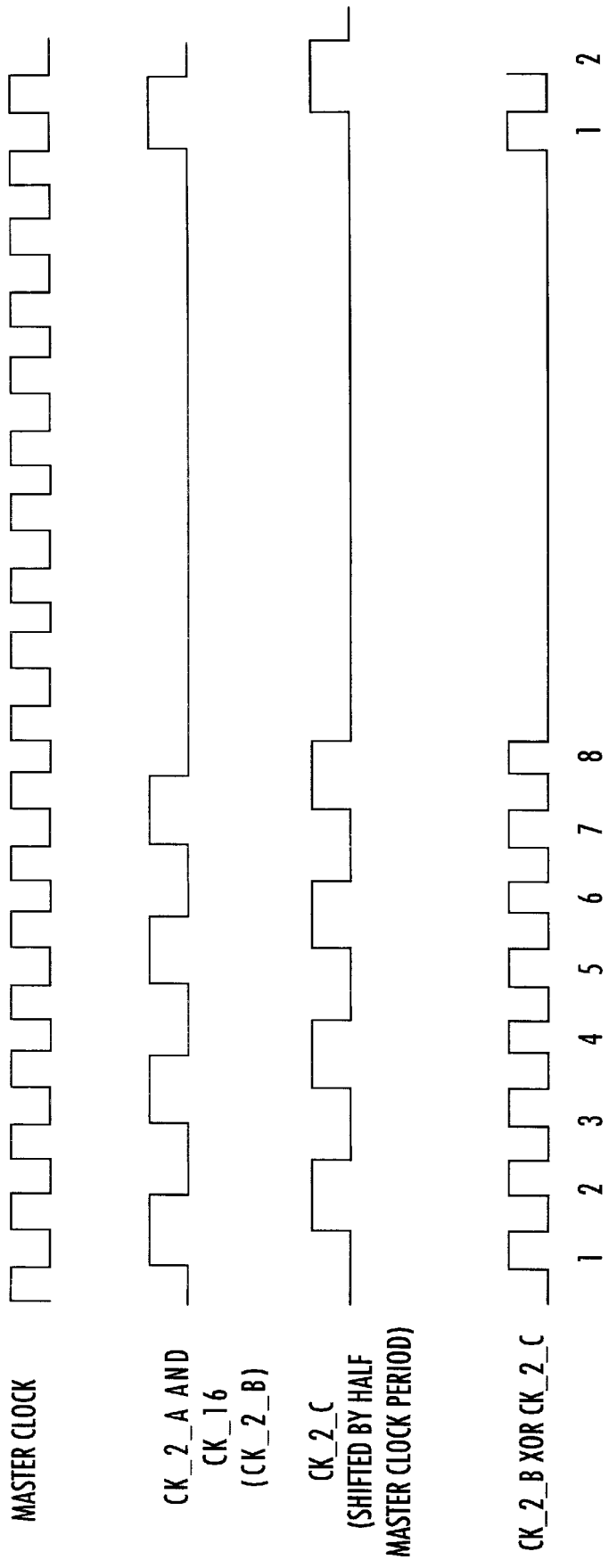

The output pair of signals, namely: CK_2_B and CK_2_C will be perfectly synchronous with the main clock signal CK while they will be out-of-phase by a semiperiod of the main clock signal CK. This pair of resynchronized out-phased signals by a semiperiod of the main clock frequency are fed to the inputs of the XOR logic circuit, at the output of which a desired windowed clock having eight active main clock periods followed by eight main clock inactive periods is obtained as diagrammatically shown in FIG. 7. The only nonsynchronous cell of the whole system is the XOR output cell. All the other blocks are synchronous in view of the two stages 4 and 5 that eliminate the delay introduced by the AND circuit. The use of an XOR circuit carefully designed so as to minimize delays, ensure satisfactory characteristics of the output windowed clock, in view of the resynchronization of the signal input to the XOR circuit.

The objective of constructing a windowed clock signal without requiring a clock signal having a "double" frequency is fulfilled by the architecture of the invention. Of course it is possible to construct windowed clock signals with active phases of any number of main clock periods by defining the required mask (which in the illustrated example was defined by employing CK_16). This may be achieved, in general terms, by the following, mutually nonexclusive options:

a) choosing a certain scale factor (16 in the illustrated example); and
 b) choosing a certain number of main clock semiperiods when mutually phase-shifting the two derived clock signals used, by a first phase-shifting block (D-Latch SHIFT).

Figure 4:
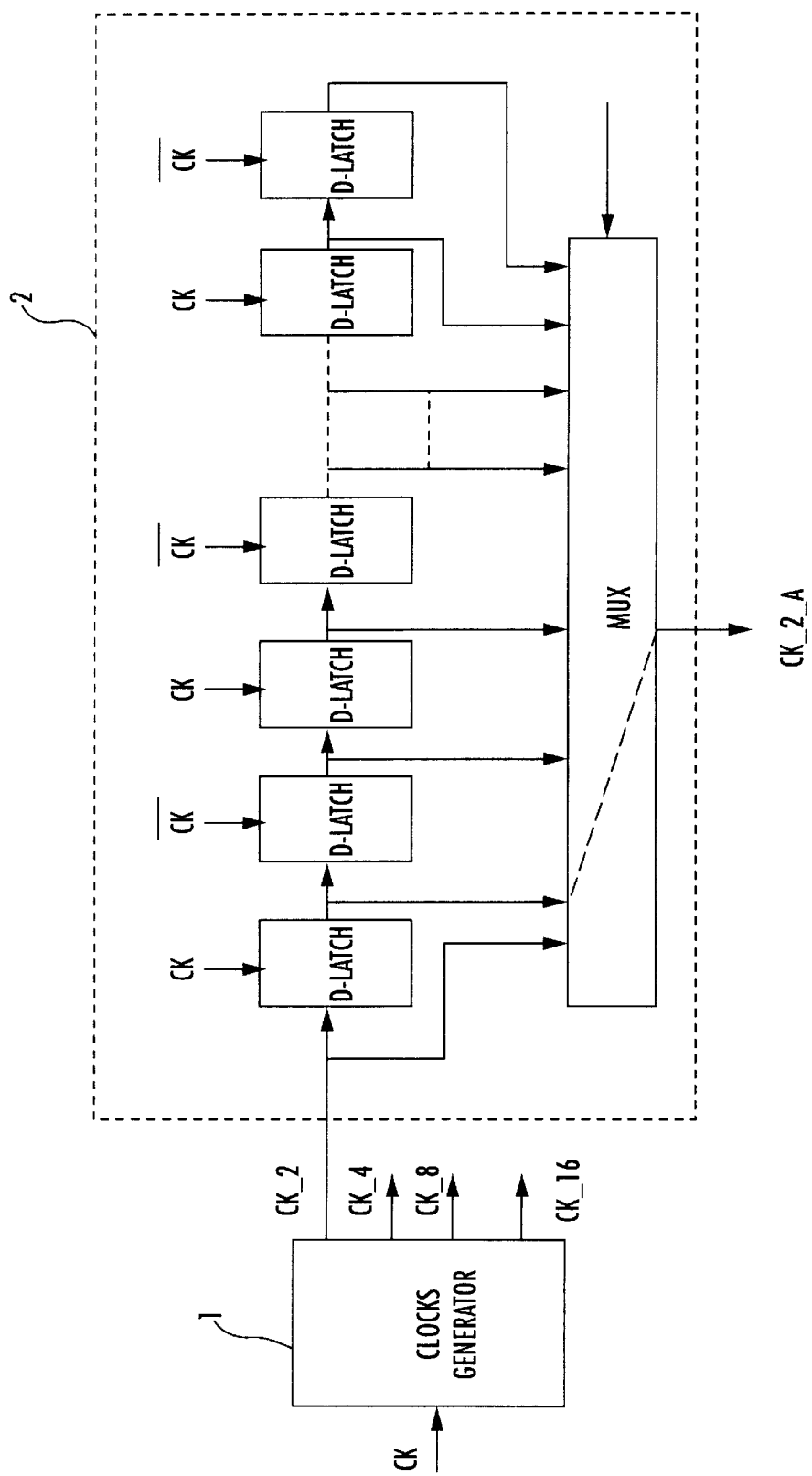
FIG. 4 shows the internal scheme of the SHIFT D-Latch block of the block diagram of FIG. 3, according to a preferred embodiment.
Figure 5:
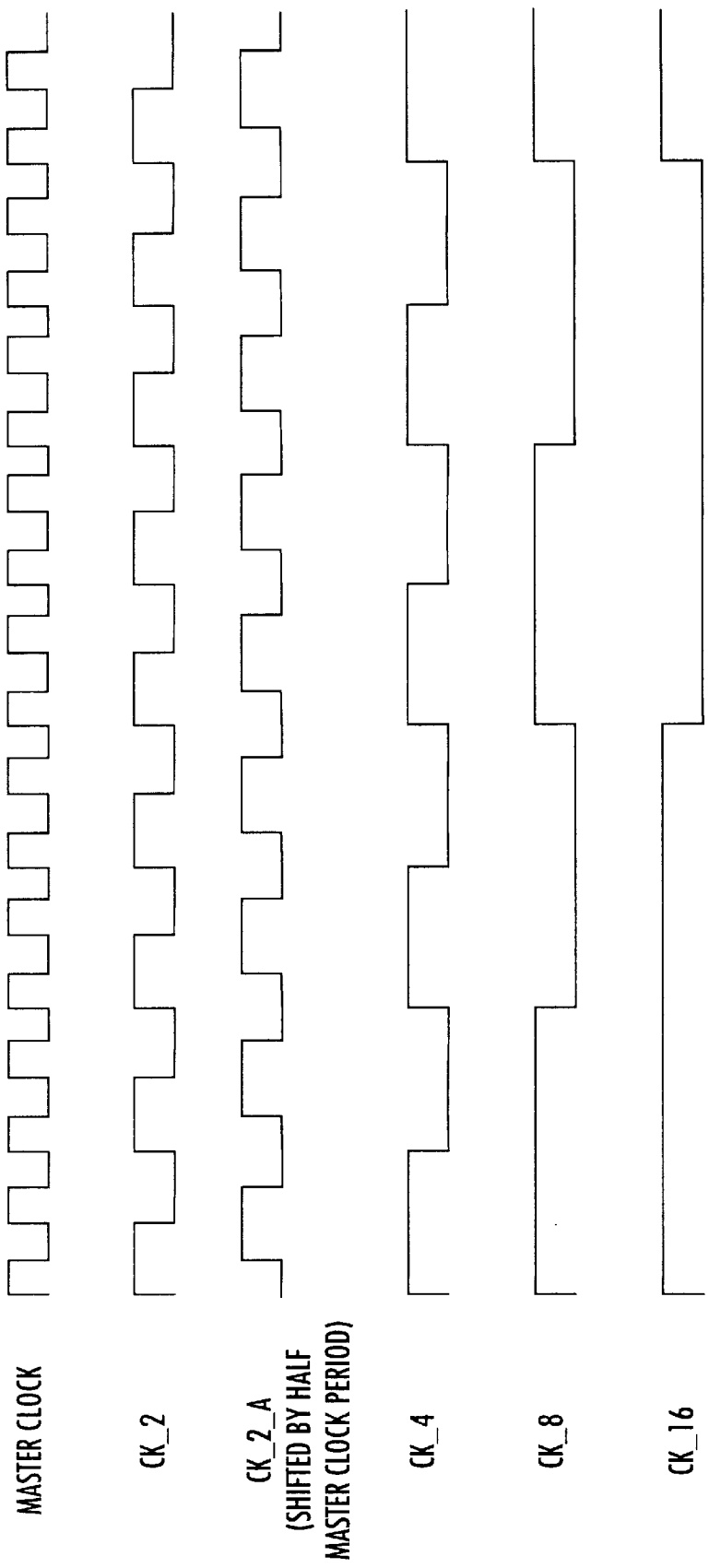
FIG. 5 shows a number of derived clock signals that are produced by digital frequency division, starting from a main clock signal.

Such a flexibility of the circuit of the invention may be implemented by realizing the block 2 (D-Latch SHIFT) as shown in FIG. 4. The block 2 may contain an array of D-Latch stages in cascade, the various nodes of which being selectable via a multiplexer MUX, to allow the selection of the desired number of main clock semiperiods by which shifting the output signal CK_2_A with respect to the input signal CK_2.

Figure 8:
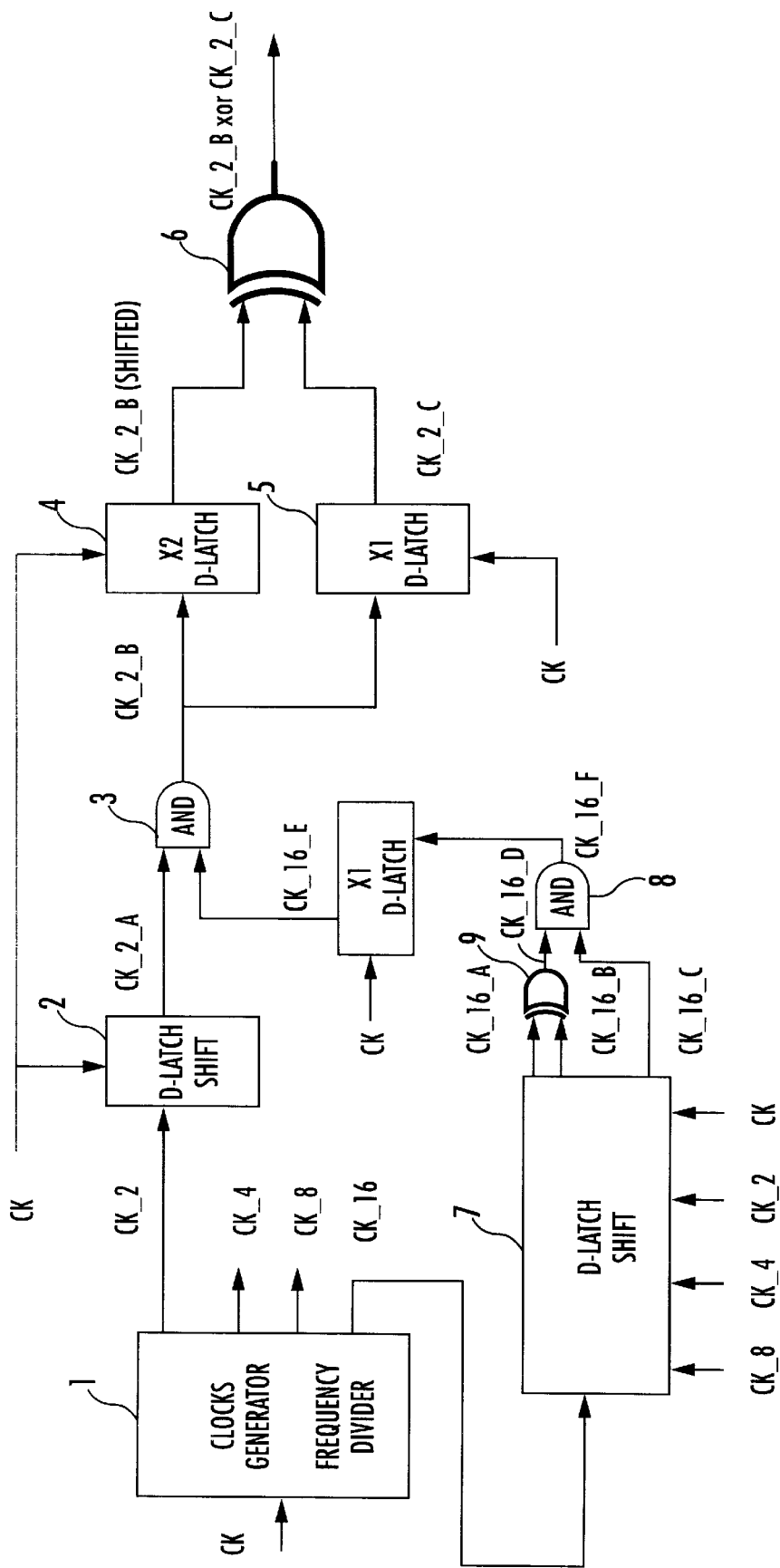
FIG. 8 shows a modified scheme of the circuit of the invention.

The basic circuit of the invention may be modified for allowing, whenever needed or useful, also the construction of an "asymmetric" windowed clock signal, that is, where the active phase and the inactive phase have a different duration, in terms of number of main clock cycles. The scheme of a circuit realized according to the present invention, having the ability to permit such an increased flexibility of definition of a ratio between the active and inactive phase different from unity, as well as the duration of the respective phases in terms of number of semiperiods of the main clock signal, is shown in FIG. 8. Compared to the basic scheme of FIG. 3, the circuit of FIG. 8 comprises an additional network for producing a second input signal to the AND 3 circuit of the basic scheme, having certain characteristics. As shown, this additional network may comprise a second phase-shifting block 7, which can be made up of one or more arrays of D-Latches in cascade, timed by the clock CK or even a different arrangement of D-Latch stages, timed by one of the fractional frequency clock signals derived from the main clock CK in order to produce a shift by a semiperiod of the respective frequency of the derived clock signal used.

Of course, the architecture of the block 7 will be optimized as a function of the number of the available fractional frequency derived clocks and of other considerations, to ensure the largest number of choices while keeping the circuit complexity to a minimum. In this case, as in the first shift block 2, a multiplexer may be advantageously included for allowing the output of a selected derived clock as required for realizing the desired windowed clock.

The network further comprises a two input AND circuit 8. To a first input is applied a signal among those produced by block 7, corresponding to a derived clock signal, shifted by an integer multiple equal to half a period of the main clock signal (CK) or any of the other derived clock signals (CK_2, CK_4, CK_8). To the other input of the AND circuit 8, may be applied a derived signal (CK_16_D) having a semiperiod whose duration corresponds to the duration of the active phase of the windowed clock signal to be constructed, which is essentially less than the semiperiod duration of the other signal applied to the other input of the AND circuit 8. The preferred embodiment of the circuit shown in FIG. 8 also indicates the optional use of a two input XOR gate 9, to which inputs can be applied two fractional frequency derived clock signals, out-of-phase among themselves by a certain number of half periods of a derived clock, of a higher frequency or also of the main clock, in order to increment the range of possible choices in constructing the signal to be applied to the respective input of the AND circuit 8.

Fundamentally, the AND circuit 8 outputs an asymmetric derived signal CK_16_F, having a certain duty-cycle that defines the ratio between active and inactive phase of the required windowed clock signal. This auxiliary network may comprise also a synchronization block 10, which can be constituted by a D-Latch stage, timed by the main clock CK. Such a "precursor" asymmetric signal CK_16_E, so resynchronized, is then supplied to the second input of the AND circuit 3 of the basic scheme of the circuit of the invention.

Figure 9:
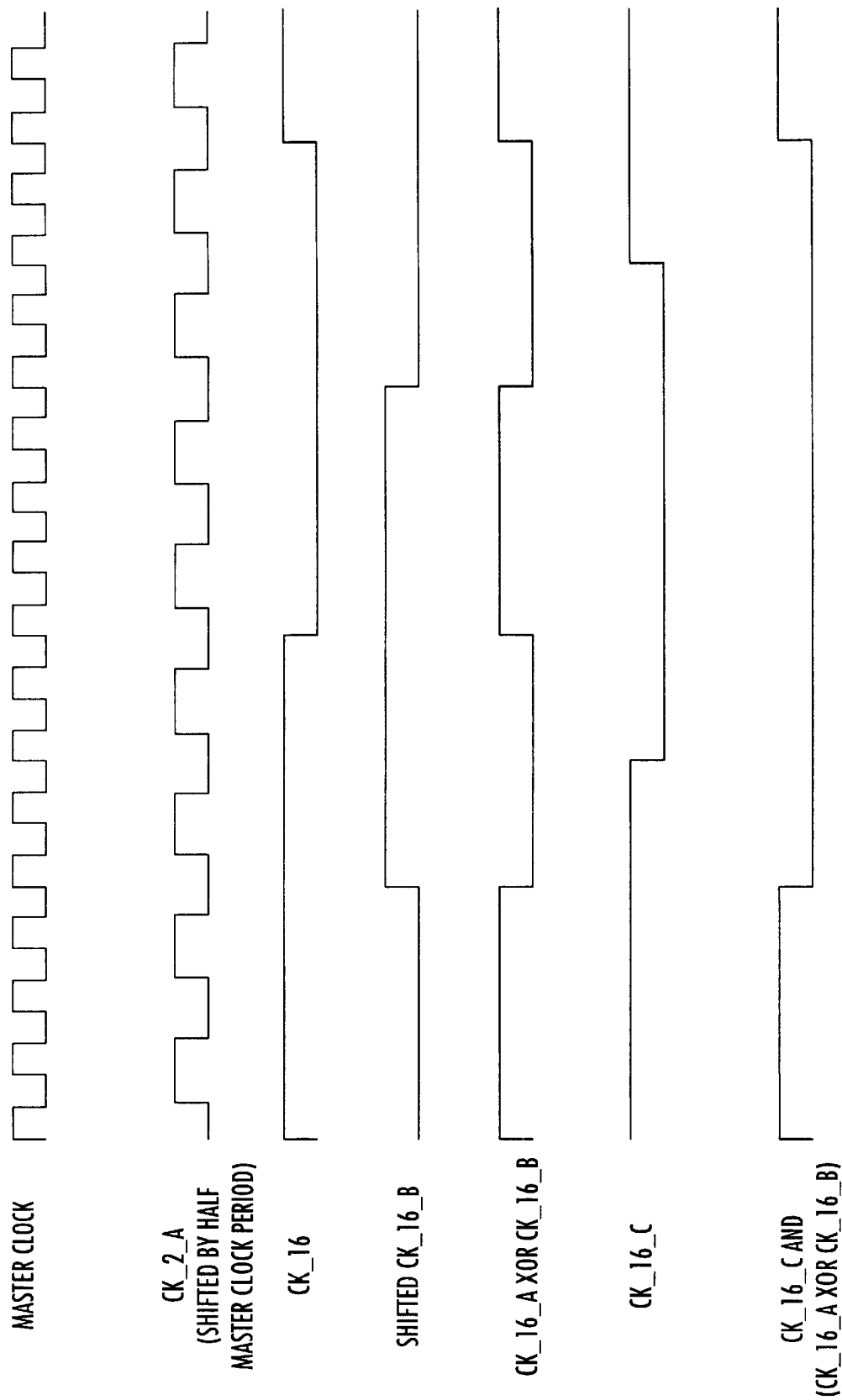
FIG. 9 and 10 diagrammatically illustrate the way an asymmetric windowed clock signal can be produced by the circuit of FIG. 8.
Figure 10:
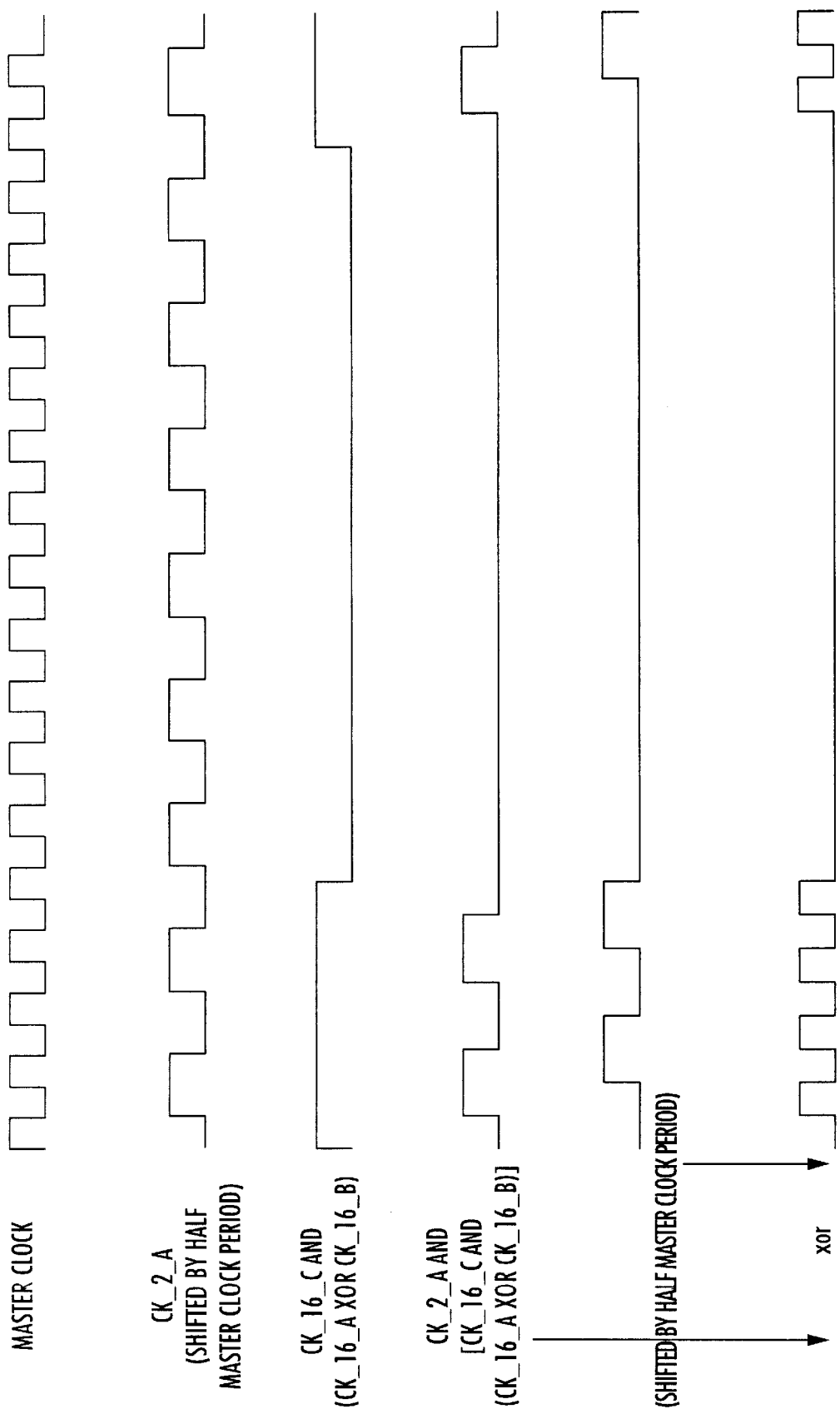

FIGS. 9 to 10 illustrate the construction of an asymmetric windowed clock signal whose active phase has a duration of 4 cycles or periods of the main clock and the same frequency of the latter, and the inactive phase has a duration that corresponds to 12 cycles of the main clock.

I claim:

1. A method for producing a windowed clock signal from a main clock signal comprising the steps of:

generating by digital frequency division at least a first derived clock signal having a first frequency 1/(2") times a frequency of the main clock signal, and a second derived clock signal having a second frequency 1/(2") times the frequency of the main clock signal, where n and m are integer numbers and m is greater than n;
 generating a logic product signal of said first and second derived clock signals;
 resynchronizing said logic product signal producing a pair of resynchronized signals, one of which is phase-shifted with respect to the other by a half period of the main clock signal; and
 generating said windowed clock signal at an output of an XOR gate based upon said pair of resynchronized signals applied to respective input of the XOR gate.

2. A method of claim 1, wherein said integer number n is equal to one, and wherein said windowed clock signal has a frequency, during active phases thereof, identical to the frequency of said main clock signal.

3. A method of claim 1, wherein a ratio between a duration of active and inactive phases of said windowed clock signal is different from one, and wherein the method further comprises the steps of:

generating a logic product signal of said second derived clock signal phase-shifted by an integer number of half periods of the main clock signal or of one of said first or second derived clock signals with a derived signal having a half period of duration equal to that of an active phase of the windowed clock signal and essentially larger than the half period of said second derived signal to produce an asymmetric clock signal having a certain duty-cycle;

resynchronizing said asymmetric clock signal with the main clock signal; and utilizing the resynchronized asymmetric clock signal for generating said logic product signal with said first derived clock signal.

4. A circuit for generating a windowed clock signal from a main clock signal comprising;

a digital frequency divider block capable of producing two or more selectable derived fractional frequency clock signals having frequencies $1/(2^n)$ times a frequency of the main clock signal;

at least one logic AND circuit receiving as input a first derived fractional frequency clock signal, and a second derived fractional frequency clock signal having a frequency lower than the first derived fractional frequency signal, said at least one logic AND circuit outputting a windowed clock signal; and resynchronization means comprising a first phase-shift block timed by said main clock signal, receiving as input the first derived fractional frequency clock signal and outputting a derived clock signal phase-shifted by an integer number of half periods of the main clock signal, said first phase-shift block having an output coupled to a first input of said at least one logic AND circuit;

at least second and third resynchronization blocks made of a different number of D-Latch stages such that a difference in the respective number of D-Latch stages is an odd number, timed by said main clock signal, each having an input coupled in common to the output of said at least one logic AND circuit, and an output; and a logic XOR logic circuit hating two inputs coupled to the outputs of said second and third resynchronization blocks, respectively, and phase-shifted, and an output on which said windowed clock signal is produced.

5. A circuit of claim 4, wherein said first phase-shift block comprises:

an array of D-Latch stages in cascade, all timed by said main clock signal, and having output taps; and a multiplexer for selecting an output tap of said array of D-Latch stages.

6. A circuit of claim 4, wherein said second resynchronization block comprises a single D-Latch stage timed by the main clock signal; and wherein said third resynchronization block comprises two D-Latch stages in cascade, both timed by said main clock signal.

7. A circuit of claim 4, further comprising an additional network for generating the second derived fractional frequency clock signal to be applied to a second input of said logic AND circuit, and wherein said additional network comprises:

a second phase-shift block receiving through an input said main clock signal and receiving through separate inputs said derived fractional frequency clock signals produced by said digital frequency divider block, and having a plurality of outputs through each of which a derived clock signal phase-shifted by an integer number of half periods of another input clock signal of said second phase-shift block is selectable; and at least a second two input logic AND circuit receiving a pair of output signals of said second phase-shift block and having an output coupled to the input of a fourth resynchronization block timed by said main clock signal and having an output from which second derived fractional frequency clock signal is generated.

8. A circuit according to claim 9, further comprising a second XOR circuit having two inputs coupled to two outputs, respectively, of said second phase-shift block and an output coupled to one input of said second logic AND circuit.

* * * * *

UNITED STATES PATENT AND TRADEMARK OFFICE
CERTIFICATE OF CORRECTION

PATENT NO. : 5,995,578
DATED : November 30, 1999
INVENTOR(S) : PAU

Page 1 of 2

It is certified that error appears in the above-identified patent and that said Letters Patent is hereby corrected as shown below:

| | |
|---|---|
| Column 2, line 18 | Strike: "For example" <br> Insert: -- For example, -- |
| Column 2, line 67 | Strike: "circuit" <br> Insert: -- circuit, -- |
| Column 3, line 22 | Strike: "produce" <br> Insert: -- produce a -- |
| Column 4, line 41 | Strike: "circuits" <br> Insert: -- circuits, -- |
| Column 6, line 51 | Strike: "1/(2")" <br> Insert: -- 1/(2") -- |
| Column 6, line 54 | Strike: "1/(2")" <br> Insert: -- 1/(2$^m$) -- |
| Column 7, line 26 | Strike: "1/(2")" <br> Insert: -- 1/(2$^n$) -- |
| Column 8, line 4 | Strike: "hating" <br> Insert: -- having -- |

UNITED STATES PATENT AND TRADEMARK OFFICE
CERTIFICATE OF CORRECTION

PATENT NO. : 5,995,578
DATED : November 30, 1999
INVENTOR(S) : PAU

It is certified that error appears in the above-identified patent and that said Letters Patent is hereby corrected as shown below:

Column 8, line 39   Strike: "claim 9,"
                    Insert: - - claim 7, - -

Signed and Sealed this

Eighth Day of August, 2000

Attest:

Q. TODD DICKINSON

Attesting Officer    Director of Patents and Trademarks